(12) United States Patent
Cheon et al.

(10) Patent No.: US 8,063,496 B2
(45) Date of Patent: Nov. 22, 2011

(54) SEMICONDUCTOR INTEGRATED CIRCUIT DEVICE AND METHOD OF FABRICATING THE SAME

(75) Inventors: Keon-Yong Cheon, Seoul (KR); Tae-Seok Oh, Seoul (KR); Jong-Won Choi, Seongnam-si (KR); Su-Young Oh, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 755 days.

(21) Appl. No.: 12/230,429

(22) Filed: Aug. 28, 2008

(65) Prior Publication Data

US 2009/0057899 A1    Mar. 5, 2009

(30) Foreign Application Priority Data

Aug. 30, 2007   (KR) .................. 10-2007-0087907

(51) Int. Cl.
*H01L 23/48* (2006.01)
(52) U.S. Cl. .................. 257/784; 257/738; 438/617
(58) Field of Classification Search .................. 257/738, 257/784; 438/617
See application file for complete search history.

(56) References Cited

U.S. PATENT DOCUMENTS

| 5,406,025 | A | * | 4/1995 | Carlstedt | .................. 174/17.08 |
| 7,122,457 | B2 | | 10/2006 | Tonida et al. | |
| 7,294,900 | B2 | * | 11/2007 | Asano | .......................... 257/472 |

FOREIGN PATENT DOCUMENTS

| JP | 2004-342690 | 12/2004 |
| JP | 2003-332417 | 11/2007 |
| KR | 10-2006-0054690 A | 5/2006 |

* cited by examiner

*Primary Examiner* — Douglas Menz
(74) *Attorney, Agent, or Firm* — Lee & Morse, P.C.

(57) ABSTRACT

A semiconductor integrated circuit device includes a semiconductor substrate including a main chip region and a pad region, a multi-layer pad structure on the pad region of the semiconductor substrate, a redistribution pad through the semiconductor substrate and in contact with a bottom surface of the multi-layer pad structure, the redistribution pad being electrically connected to the multi-layer pad structure, a trench belt through the semiconductor substrate and surrounding the redistribution pad, the trench belt electrically isolating the redistribution pad and a portion of the semiconductor substrate adjacent to the redistribution pad, and a connection terminal on the redistribution pad, the connection terminal electrically connecting the redistribution pad to an external source.

20 Claims, 10 Drawing Sheets

SEMICONDUCTOR INTEGRATED CIRCUIT DEVICE AND METHOD OF FABRICATING THE SAME

BACKGROUND OF THE INVENTION

1. Field of the Invention

Embodiments of the present invention relate to a semiconductor integrated circuit device and a method of fabricating the same. More particularly, embodiments of the present invention relate to a semiconductor integrated circuit device with a simplified structure and a method of fabricating the same.

2. Description of the Related Art

As electronic devices become smaller, lighter, and thinner, semiconductor integrated circuits in electronic devices may require smaller, lighter, and thinner dimensions as well. Accordingly, semiconductor package technology has evolved from, e.g., a dual in line package (DIP), a small outline with J-lead (SOJ), and a quad flat package (QFP), into, e.g., a ball grid array (BGA) and a chip scale package (CSP). Further, attempts have been made to improve package technology, e.g., a system in package (SiP), a package in package (PiP), a flip chip stacked-CSP (FCS-CSP), and so forth.

Package technology refers to implementation of a three-dimensional package structure of a system at a package level. The conventional implementation of package technology may include use of stack technology, embedded technology for embedding active and passive devices with chips, and through silicon via (TSV) technology.

The TSV technology may connect individual parts or chips to each other using thousands of micro-wires to facilitate signal exchange therebetween. In particular, the conventional TSV technology may include forming hole patterns on a semiconductor substrate in order to form micro-wires and forming an insulation film in order to electrically isolate the micro-wires from the semiconductor substrate. The number of required processes in the conventional TLV, however, may be large, so production of a semiconductor integrated circuit device may be complicated. Further, the large number of processes in the conventional TLV may increase production costs of the semiconductor integrated circuit device, while reducing processing efficiency thereof. Consequently, productivity of the semiconductor integrated circuit device may be reduced.

SUMMARY OF THE INVENTION

Embodiments of the present invention are therefore directed to a semiconductor integrated circuit device and a method of fabricating the same, which substantially overcome one or more of the disadvantages of the related art.

It is therefore a feature of an embodiment of the present invention to provide a semiconductor integrated circuit device with enhanced productivity.

It is another a feature of an embodiment of the present invention to provide a method of fabricating a semiconductor integrated circuit device with enhanced productivity.

At least one of the above and other features and advantages of the present invention may be realized by providing a semiconductor integrated circuit device, including a semiconductor substrate having a main chip region and a pad region, a multi-layer pad structure on the pad region of the semiconductor substrate, a redistribution pad through the semiconductor substrate and in contact with a bottom surface of the multi-layer pad structure, the redistribution pad being electrically connected to the multi-layer pad structure, a trench belt through the semiconductor substrate and surrounding the redistribution pad, the trench belt electrically isolating the redistribution pad and a portion of the semiconductor substrate adjacent to the redistribution pad, and a connection terminal on the redistribution pad, the connection terminal electrically connecting the redistribution pad to an external source.

The multi-layer pad structure may include a conductive material, the multi-layer pad structure being a stacked structure of a contact, a plurality of lines, and a plurality of vias connecting the lines to one other. The semiconductor integrated circuit device may further include a plurality of multi-layer pad structures on the pad region of the semiconductor substrate, the redistribution pad being electrically connected to each of the multi-layer pad structures. The semiconductor integrated circuit device may further include a pad contact hole through the semiconductor substrate, the pad contact hole exposing the bottom surface of the multi-layer pad structure, and the redistribution pad being on a portion of a bottom surface of the semiconductor substrate and on sidewalls of the pad contact hole. A depth of the trench belt may be greater than a thickness of the semiconductor substrate. The semiconductor integrated circuit device may further include a passivation film on a bottom surface of the semiconductor substrate to bury the trench belt, the connection terminal being configured through the passivation film.

At least one of the above and other features and advantages of the present invention may be also realized by providing a semiconductor integrated circuit device, including a semiconductor substrate having a main chip region and a pad region, a plurality of inter-layer insulation films on the semiconductor substrate, a multi-layer pad structure on the semiconductor substrate, the multi-layer pad structure penetrating through the inter-layer insulation films in the pad region of the semiconductor substrate, a pad contact hole through the semiconductor substrate, the pad contact hole exposing a bottom surface of the multi-layer pad structure, a redistribution pad in the pad contact hole and on portions of a bottom surface of the semiconductor substrate, the redistribution pad being electrically connected to the multi-layer pad structure, a trench belt through the semiconductor substrate and surrounding the redistribution pad, the trench belt electrically isolating the redistribution pad and a portion of the semiconductor substrate adjacent to the redistribution pad, a passivation film on the bottom surface of the semiconductor substrate and on the redistribution pad, the passivation film burying the trench belt and the pad contact hole, and a connection terminal through the passivation film and exposed therethrough, the connection terminal being on the redistribution pad and electrically connected thereto. The multi-layer pad structure may be a stacked structure of a contact, a plurality of lines, and a plurality of vias connecting the lines to one other. The connection terminal may be a solder ball. The pad region of the semiconductor substrate may include a plurality of multi-layer pad structures, the redistribution pad being electrically connected to each of the multi-layer pad structures. A depth of the trench belt is greater than a thickness of the semiconductor substrate.

At least one of the above and other features and advantages of the present invention may be also realized by providing a method of fabricating a semiconductor integrated circuit device, including forming a multi-layer pad structure on a pad region of a semiconductor substrate, forming a redistribution pad through the semiconductor substrate and in contact with a bottom surface of the multi-layer pad structure, the redistribution pad being electrically connected to the multi-layer pad structure, forming a trench belt through the semiconductor substrate and surrounding the redistribution pad, the trench belt electrically isolating the redistribution pad and a portion of the semiconductor substrate adjacent to the redistribution pad, and forming a connection terminal on the redistribution pad and electrically connecting the redistribution pad to the outside.

Forming the multi-layer pad structure may include forming an integrated circuit structure with a plurality of contacts, a plurality of lines, and a plurality of vias connecting the lines to one another. Forming the redistribution pad may include forming a pad contact hole through the semiconductor substrate, the pad contact hole exposing the bottom surface of the multi-layer pad structure, and conformally forming the redistribution pad in the pad contact hole and on portions of a bottom surface of the semiconductor substrate. The method may further include a plurality of multi-layer pad structures on the semiconductor substrate, such that the redistribution pad is electrically connected to each of the multi-layer pad structures. Forming the trench belt may include over-etching the semiconductor substrate, such that a depth of the trench belt is greater than a thickness of the semiconductor substrate. Forming the trench belt may include separating the trench belt from the pad contact hole by a predetermined distance. Forming the redistribution pad may include electro-plating a redistribution pad seed layer. The method may further include forming a passivation film on the bottom surface of the semiconductor substrate and on the redistribution pad, such that the trench belt is buried. The connection terminal may be formed through the passivation film, a portion of the connection terminal being exposed to an outside through the passivation film.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
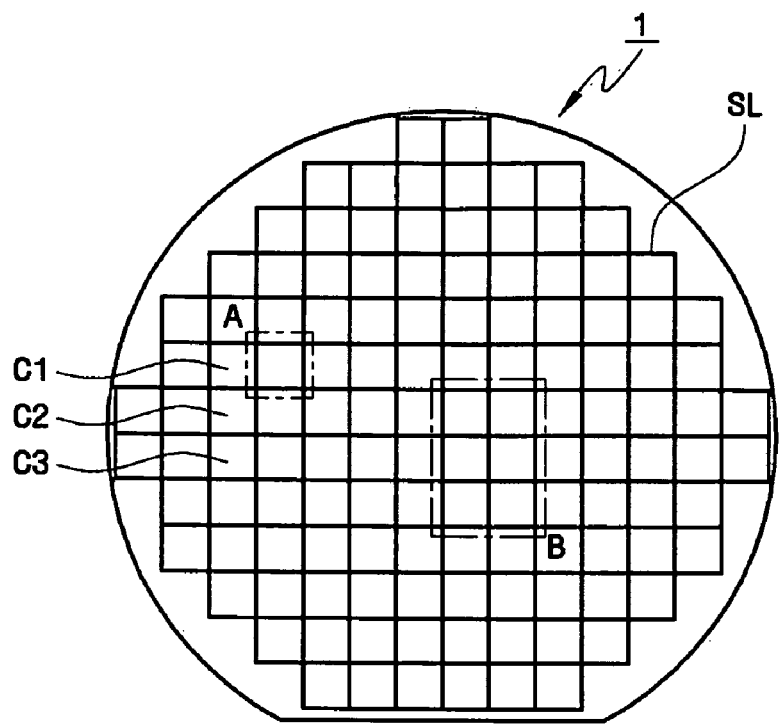
FIG. 1 illustrates a schematic, top view of a wafer including a plurality of semiconductor integrated circuit devices according to an exemplary embodiment of the present invention.

Korean Patent Application No. 10-2007-0087907, filed on Aug. 30, 2007, in the Korean Intellectual Property Office, and entitled: "Semiconductor Integrated Circuit Device and Method of Fabricating the Same," is incorporated by reference herein in its entirety.

Exemplary embodiments of the present invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of elements and regions may be exaggerated for clarity of illustration. It will also be understood that when an element is referred to as being "on" another element or substrate, it can be directly on the other element or substrate, or intervening elements may also be present. Further, it will be understood that the term "on" can indicate solely a vertical arrangement of one element with respect to another element, and may not indicate a vertical orientation, e.g., a horizontal orientation. In addition, it will also be understood that when an element is referred to as being "between" two elements, it can be the only element between the two elements, or one or more intervening elements may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

Embodiments of the invention are described herein with reference to plan and cross-section illustrations of idealized embodiments of the invention. As such, variations from the structures illustrated in the drawing figures, e.g., due to manufacturing techniques and/or tolerances, are to be expected. Accordingly, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Figure 2:
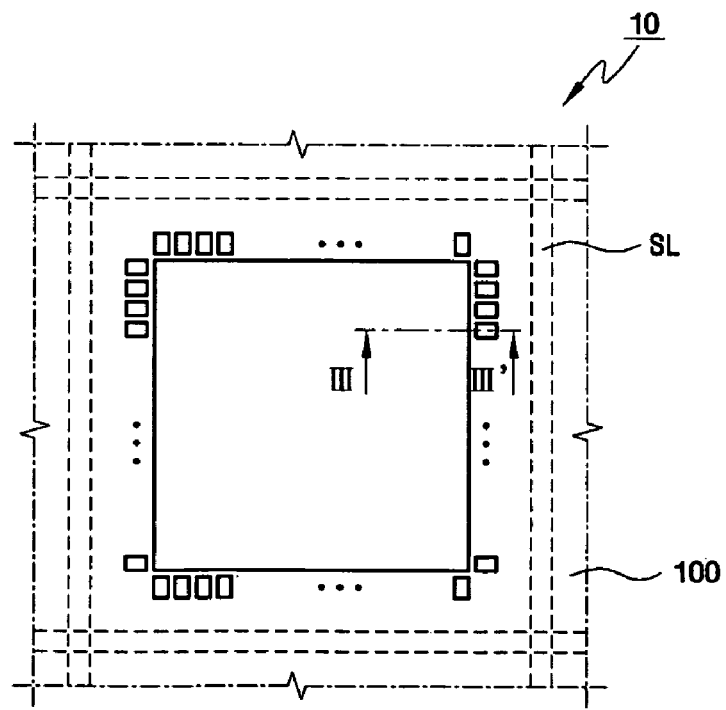
FIG. 2 illustrates an enlarged, top view of a semiconductor integrated circuit device in portion A of FIG. 1.
Figure 3:
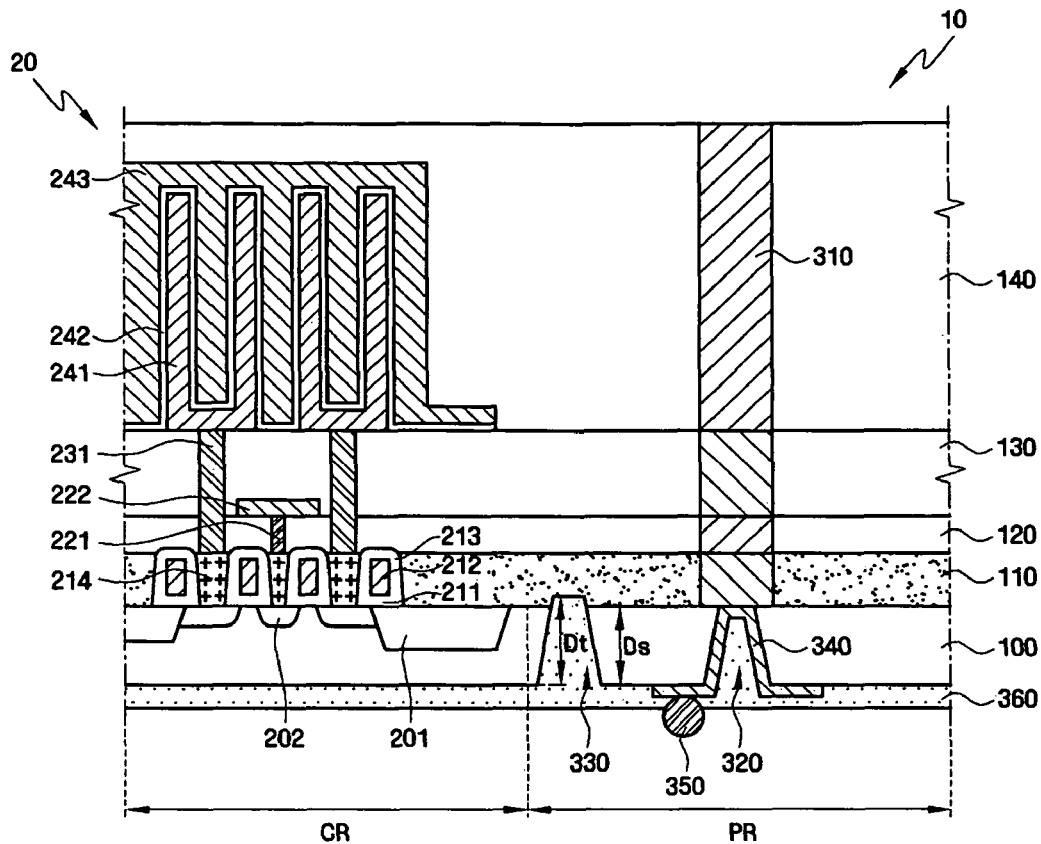
FIG. 3 illustrates a cross-sectional view along line III-III' of FIG. 2.
Figure 4:
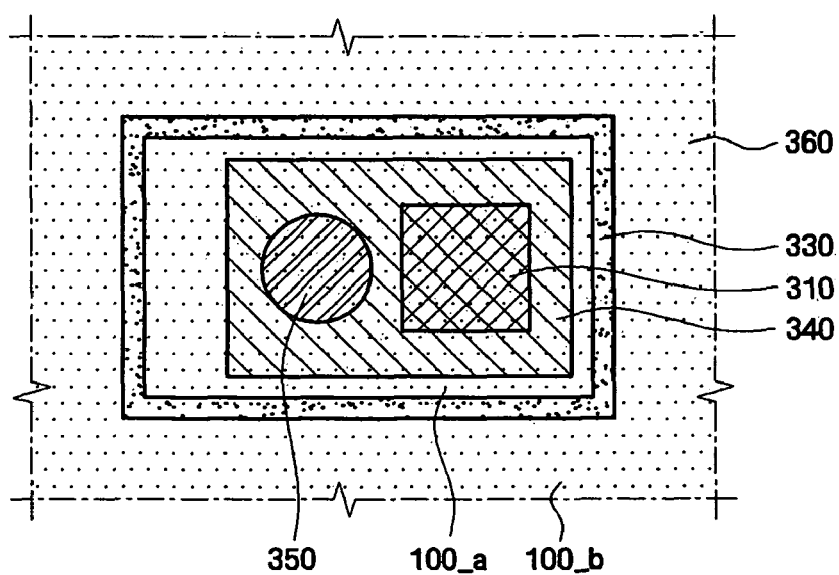
FIG. 4 illustrates a schematic, bottom view of a pad region of the semiconductor integrated circuit device of FIG. 3.

Hereinafter, a semiconductor integrated circuit device according to an exemplary embodiment of the present invention will be described in detail with reference to FIGS. 1-4. FIG. 1 illustrates a top view of a wafer 1 including a plurality of semiconductor integrated circuit devices C1 through C3 according to an exemplary embodiment of the present invention. FIG. 2 illustrates an enlarged view of portion A of FIG. 1 for explaining a semiconductor integrated circuit device 10 according to an exemplary embodiment of the present invention. FIG. 3 illustrates a cross-sectional view of the semiconductor integrated circuit device 10 taken along line III-III' of FIG. 2. FIG. 4 illustrates a bottom view of a pad region PR of the semiconductor integrated circuit device 10 in FIG. 3.

Referring to FIG. 1, the wafer 1 may include a plurality of semiconductor integrated circuit devices, e.g., semiconductor integrated circuit devices C1 through C3, divided by scribe lines SL. The semiconductor integrated circuit devices C1 through C3 may be semiconductor integrated circuit devices of a substantially same type, e.g., memory chips, or may be semiconductor integrated circuit devices of different types for performing different operation to complete one function, e.g., a memory chip, an application-specific integrated circuit (ASIC) chip, and a processor. Therefore, embodiments of the present invention may be applied not only to a single semiconductor integrated circuit device, e.g., the semiconductor integrated circuit device 10 in portion A, but also to a M×N array chip of semiconductor integrated circuit devices required to form one module, e.g., a 2×3 array chip B.

Referring to FIGS. 2-4, the semiconductor integrated circuit device 10 may include a semiconductor substrate 100 having a main chip region CR and the pad region PR. A multi-layer pad structure 310, a redistribution pad 340, a connection terminal 350, a trench belt 330, and a passivation film 360 may be formed on the pad region PR. An integrated circuit structure 20 may be formed on the main chip region CR.

The semiconductor substrate 100 may be a silicon semiconductor substrate, a silicon on insulator (SOI) semiconductor substrate, a gallium arsenic semiconductor substrate, a silicon germanium semiconductor substrate, a ceramic semiconductor substrate, a quartz semiconductor substrate, or a display glass semiconductor substrate. The semiconductor substrate 100 may be a P-type semiconductor substrate. For example, a P-type epitaxial layer (not shown) may be grown on the semiconductor substrate 100.

The semiconductor substrate 100 may include the main chip region CR and the pad region PR surrounding the main chip region CR, as illustrated in FIG. 2. As illustrated in FIG. 3, the integrated circuit structure 20 of the semiconductor integrated circuit device 10 may be formed on the main chip region CR of the semiconductor substrate 100, and devices electrically connecting the integrated circuit structure 20 to the outside may be formed on the pad region PR. It is noted, however, that other configurations of the pad region PR with respect to the main chip region CR region according to a type and characteristics of the semiconductor integrated circuit device 10 are within the scope of the present invention.

The integrated circuit structure 20 of the semiconductor integrated circuit device 10 may have any suitable structure. An exemplary structure of the integrated circuit structure 20 of the semiconductor integrated circuit device 10 may be as follows. As illustrated in FIG. 3, a device isolation region 201 may be formed on the semiconductor substrate 100 in the main chip region CR to define an active region. The device isolation region 201 may be, e.g., a field oxide (FOX) or a shallow trench isolation (STI) region, formed, e.g., by a local oxidation of silicon (LOCOS) method. As further illustrated in FIG. 3, a transistor including a gate insulation film 211, a gate electrode 212, a spacer 213, and a source/drain region 202 may be formed in the main chip region CR.

More specifically, the gate insulation film 211 may be formed in the main chip region CR on the semiconductor substrate 100, and the gate electrode 212 made of, e.g., polycrystalline silicon, may be formed on the gate insulation film 211. The spacer 213 may be formed on both sidewalls of the gate electrode 212, and the source/drain region 202 may be formed by ion-implanting impurities using the gate electrode 212 with the spacer 213 as an ion implantation mask.

As further illustrated in FIG. 3, a self-aligned contact 214 may be formed on a region of the semiconductor substrate 100. In particular, the self-aligned contact 214 may be formed on a portion of the main chip region CR to contact the source/drain region 202, e.g., the self-aligned contact 214 may overlap a portion of the active region of the integrated circuit structure 20. A first inter-layer insulation film 110 may be formed on a portion of the semiconductor substrate 100 not including the self-aligned contact 214. In particular, the first inter-layer insulation film 110 may be in the pad region PR and in a portion of the main chip region CR, e.g., the first inter-layer insulation film 110 may overlap the device isolation region 201. The first inter-layer insulation film 110 may include an insulating material, e.g., one or more of a flowable oxide (FOX) film, a tonen silazene (TOSZ) film, an undoped silicate glass (USG) film, a borosilicate glass (BSG) film, a phosphosilicate glass (PSG) film, a borophosphosilicate glass (BPSG) film, a plasma enhanced-tetra ethyl ortho silicate (PE-TEOS) film, a fluoride silicate glass (FSG) film, and/or a high density plasma film.

A second inter-layer insulation film 120, as illustrated in FIG. 3, may be formed on the semiconductor substrate 100, e.g., on the first inter-layer insulation film 110 and on the self-aligned contact 214. The second inter-layer insulation film 120 may include a bitline contact 221, and a bitline 222 may be formed on a portion of the second inter-layer insulation film 120. The bitline contact 221 may electrically connect the self-aligned contact 214 to the bitline 222, and may be formed of a conductive material, e.g., tungsten (W) or tungsten alloy. The bitline 222 may overlap the self-aligned contact 214, and may be formed of, e.g., ruthenium (Ru), rhodium (Rh), osmium (Os), palladium (Pd), platinum (Pt), tungsten (W), molybdenum (Mo), titanium (Ti), tantalum (Ta), aluminum (Al), copper (Cu), hafnium (Hf), zirconium (Zr), iridium (Ir), tungsten nitride (WN), molybdenum-nitride (MoN), titanium nitride (TiN), tantalum nitride (TaN), aluminum nitride (AlN), hafnium nitride (HfN), zirconium nitride (ZrN), tantalum silicon nitride (TaSiN), ruthenium oxide ($RuO_2$), iridium oxide ($IrO_2$), and/or a combination of thereof.

A third inter-layer insulation film 130, as further illustrated in FIG. 3, may be formed on the second inter-layer insulation film 120 to cover the bitline contact 221 and the bitline 222, i.e., the bitline 222 may be between the second and third inter-layer insulating films 120 and 130. A storage electrode contact 231 may be formed through the second and third inter-layer insulation films 120 and 130 to electrically connect a storage electrode 241 to the self-aligned contact 214. The storage electrode contact 231 may be formed of a conductive material, e.g., polycrystalline silicon.

The storage electrode 241 may be formed on the third inter-layer insulation film 130, and may have a cylindrical shape in order to enhance integration density and capacitance. The storage electrode 241 may be formed of a conductive material, e.g., polycrystalline silicon, and/or of a metal material, e.g., Ru, Rh, Os, Pd, Pt, W, Mo, Ti, Ta, Al, Cu, Hf, Zr, Ir, WN, MoN, TiN, TaN, AlN, HfN, ZrN, TaSiN, $RuO_2$, $IrO_2$, or a combination of the same. The storage electrode 241 may also have a stacked structure of metal and polycrystalline silicon.

As further illustrated in FIG. 3, a dielectric film 242 may be conformally formed on the storage electrode 241 and along a profile of the storage electrode 241. The dielectric film 242 may be formed of a dielectric material having a high dielectric constant (high-k), so that a desired capacitance can be achieved even when the size of the storage electrode 241 is reduced. For example, the dielectric film 242 may be formed of $HfO_2$, HfSiO, HfAlO, $ZrO_2$, ZrSiO, ZrAlO, $Ta_2O_5$, $TiO_2$, $Al_2O_3$, $Nb_2O_5$, $CeO_2$, $Y_2O_3$, $InO_3$, $IrO_2$, $SrTiO_3$, $PbTiO_3$, $SrRuO_3$, $CaRuO_3$, $(BaSr)TiO_3$, $Pb(Zr,Ti)O_3$, $(Pb,La)(Zr,Ti)O_3$, $(Sr,Ca)RuO_3$, or a stack, e.g., a laminate structure, thereof. In addition, the dielectric film 242 may be a stacked layer having high dielectric constant, e.g., Oxide-Nitride-Oxide (ONO).

As illustrated in FIG. 3, a plate electrode 243 may be formed on each storage electrode 241, such that the dielectric film 242 may be formed between the plate electrode 243 and the storage electrode 241. The plate electrode 243 may be formed of a substantially same conductive material as the storage electrode 241. For example, the plate electrode 243 may be formed of polycrystalline silicon and/or a metal material. In addition, a fourth inter-layer insulation film 140 may be formed on the third inter-layer insulation film 130 on which the plate electrode 243 is formed.

The integrated circuit structure 20 formed on the main chip region CR of the semiconductor integrated circuit device 10 has been described above. However, other configurations of the integrated circuit structure 20, e.g., additional inter-layer insulation films may be formed on the fourth inter-layer insulation film 140, in accordance with a purpose of semiconductor integrated circuit device 10, are within the scope of the present invention. In other words, the integrated circuit structure 20 formed on the main chip region CR may be changed in various forms by a person of ordinary skill in the art.

The multi-layer pad structure 310, the redistribution pad 340, the connection terminal 350, and the trench belt 330 may be formed in the pad region PR of the semiconductor substrate 100. The multi-layer pad structure 310 may be connected to the integrated circuit structure 20 via an inner line (not shown) and to an external source (not shown) via the redistribution pad 340 and the connection terminal 350. Accordingly, the multi-layer pad structure 310 may facilitate signal transmission of the semiconductor integrated circuit device 10.

The multi-layer pad structure 310 may extend through the first to fourth inter-layer insulation films 110 to 140 to contact the semiconductor substrate 100. The multi-layer pad structure 310 may include a plurality of stacked contacts (not shown), lines (not shown) and/or vias (not shown) connecting the lines and/or contacts. The lines, contacts, and/or vias may correspond to each of the first through fourth inter-layer insulation films 110 through 140. Each line, contact, and/or via may be formed of a conductive material, e.g., Ru, Rh, Os, Pd, Pt, W, Mo, Ti, Ta, Al, Cu, Hf, Zr, Ir, WN, MoN, TiN, TaN, AlN, HfN, ZrN, TaSiN, $RuO_2$, $IrO_2$, or a combination thereof.

As illustrated in FIG. 3, a bottom surface of the multi-layer pad structure 310 may contact an upper surface of the semiconductor substrate 100, e.g., the bottom surface of the multi-layer pad structure 310 may be directly on the upper surface of the semiconductor substrate 100, and may be electrically connected to the semiconductor substrate 100. The electrical contact between the multi-layer pad structure 310 and the semiconductor substrate 100 may facilitate electrical contact between the multi-layer pad structure 310 and the redistribution pad 340, as will be described in more detail below, thereby eliminating a need of a separate hole in the first inter-layer insulation film 110 and/or in the semiconductor substrate 100 to electrically connect the multi-layer pad structure 310 to the redistribution pad 340. Accordingly, a laser process for forming a hole may not be required, so fabrication of the semiconductor integrated circuit device 10 may be simplified and production costs thereof may be reduced, thereby increasing processing efficiency and productivity.

The multi-layer pad structure 310 may be formed by adding a pad pattern, i.e., a pattern for forming the multi-layer pad structure 310, to a layout of a mask used for forming the integrated circuit structure 20 in the main chip region CR. Therefore, the mask used for forming the integrated circuit structure 20 and the multi-layer pad structure 310 may include a discontinuous surface corresponding to the integrated circuit structure 20 and the multi-layer pad structure 310. For example, the mask may be applied on an entire semiconductor substrate 100 during each processing step, so corresponding portions of the multi-layer pad structure 310 and of the integrated circuit structure 20, i.e., parts of the multi-layer pad structure 310 and of the integrated circuit structure 20 formed on a substantially same vertical level with respect to the semiconductor substrate 100, may be formed simultaneously. Accordingly, no separate process may be required to form the multi-pad structure 310 because the multi-layer pad structure 310 may be formed in the pad region PR at a substantially same time the integrated circuit structure 20 is being formed in the main chip region CR.

The multi-layer pad structure 310 may exchange electrical signals with the integrated circuit structure 20 in the main chip region CR through an inner line (not illustrated). In addition, the multi-layer pad structure 310 may exchange electrical signals with an external source, i.e., a source external to the semiconductor integrated circuit device 10, through the redistribution pad 340.

The redistribution pad 340 may be formed in the semiconductor substrate 100, and may contact the bottom surface of the multi-layer pad structure 310. In particular, the semiconductor substrate 100 may include a pad contact hole 320 extending from a bottom surface of the semiconductor substrate 100 toward the upper surface of the semiconductor substrate 100 to expose the bottom surface of the multi-layer pad structure 310. The redistribution pad 340 may be positioned in the pad contact hole 320 to electrically connect to the multi-layer pad structure 310 at the upper surface of the semiconductor substrate 100.

For example, the redistribution pad 340 may extend conformally inside the pad contact hole 320, i.e., along sidewalls of the pad contact hole 320 and on the exposed bottom surface of the multi-layer pad structure 310, and on portions of the bottom surface of the semiconductor substrate 100, as illustrated in FIG. 3. Accordingly, a portion of the redistribution pad 340 in direct contact with the bottom surface of the multi-layer pad structure 310 may be substantially level with the upper surface of the semiconductor substrate 100. The redistribution pad 340 may not fill completely the pad contact hole 320, as illustrated in FIG. 3, so a space may be formed between portions of the redistribution pad 340 on opposing sidewalls of the pad contact hole 320. Accordingly, the redistribution pad 340 may be exposed in the pad contact hole 320. The redistribution pad 340 may be formed of a conductive material, e.g., Rh, Os, Pd, Pt, W, Mo, Ti, Ta, Al, Cu, Hf, Zr, Ir, WN, MoN, TiN, TaN, AlN, HfN, ZrN, TaSiN, $RuO_2$, $IrO_2$, or a combination thereof.

The connection terminal 350 may be formed on the redistribution pad 340, so the redistribution pad 340 may be between the connection terminal 350 and the bottom surface of the semiconductor substrate 100. For example, the connection terminal may be on a portion of the redistribution pad 340 extending on the bottom surface of the semiconductor substrate 100. The connection terminal 350 may have any suitable shape, e.g., a solder ball, and may be formed of a conductive material, e.g., Pb, Sn, Ag, Cu, Zn, Bi, In, Al, or a combination thereof. The connection terminal 350 may be electrically connected to the redistribution pad 340, so the connection terminal 350, the redistribution pad 340, and the multi-layer pad structure 310 may be electrically inter-connected. Accordingly, a signal received from an external source through the connection terminal 350 may be delivered to the multi-layer pad structure 310 via the redistribution pad 340. Similarly, the multi-layer pad structure 310 may transmit an electrical signal to the external source via the redistribution pad 340 and the connection terminal 350. In this way, the connection terminal 350 may function as a passage of the semiconductor integrated circuit device 10 for exchanging signals with external sources.

The trench belt 330 may be in the semiconductor substrate 100. In particular, as illustrated in FIG. 3, the trench belt 330 may extend from the bottom surface of the semiconductor substrate 100 through the semiconductor substrate 100, and may penetrate into the first inter-layer insulation film 110. More specifically, the trench belt 330 may completely penetrate through the semiconductor substrate 100, so an upper surface of the trench belt 330 may be vertically higher than the upper surface of the semiconductor surface 100 with respect to the bottom surface of the semiconductor substrate 100. In other words, as illustrated in FIG. 3, a depth Dt of the trench belt 330, i.e., a vertical distance as measured between the bottom surface of the semiconductor substrate 100 and an upper surface of the trench belt 330, may be greater than a thickness Ds of the semiconductor substrate 100, i.e., a vertical distance as measured between the bottom and upper surfaces of the semiconductor substrate 100. Accordingly, a portion of each sidewall of the trench belt 330 may overlap a portion of the first inter-layer insulation film 110.

As illustrated in FIG. 4, the trench belt 330 may surround the redistribution pad 340. Accordingly, the redistribution pad 340 and an internal semiconductor substrate 100_a, i.e., a portion of the semiconductor substrate 100 immediately adjacent to the redistribution pad 340, may be physically isolated from an external semiconductor substrate 100_b by the trench belt 330, as further illustrated in FIG. 4. In other words, the trench belt 330 may be formed to separate the semiconductor substrate 100 into the internal and external semiconductor substrates 110_a and 100_b, as illustrated in FIG. 4, so elements formed on the internal semiconductor substrate 110_a may be completely isolated from elements formed on the external semiconductor substrate 110_b.

As illustrated in FIGS. 3-4, a passivation film 360 may be formed on the entire bottom surface of the semiconductor substrate 100 and on the redistribution pad 340 to bury the trench belt 330 and the pad contact hole 320. Since the passivation film 360 buries the trench belt 330, an upper surface of the internal semiconductor substrate 100_a immediately adjacent to the redistribution pad 340 may contact the first inter-layer insulation film 110, sidewalls of the internal semiconductor substrate 100_a may contact the trench belt 330, and a bottom surface of the internal semiconductor substrate 100_a may contact the passivation film 360. Therefore, the redistribution pad 340 and the internal semiconductor substrate 100_a may be electrically insulated from the external semiconductor substrate 100_b. As such, no separate insulation film may be required between the redistribution pad 340 and the semiconductor substrate 100, so fabrication of the semiconductor integrated circuit device 10 may be simplified and costs thereof may be reduced, thereby increasing yield and productivity.

The semiconductor integrated circuit device 10 according to embodiments of the present embodiment may be advantageous in reducing the number of required holes, i.e., no additional hole and/or bump may be needed for connecting the redistribution pad 340 and the multi-layer pad structure 310, and insulation films, i.e., no additional insulation may be needed between the redistribution pad 340 and the semiconductor substrate 100. Therefore, the number of processing stages during fabrication of the semiconductor integrated circuit device 10 may be reduced and simplified, thereby reducing production costs and increasing processing efficiency and productivity.

Figure 5:
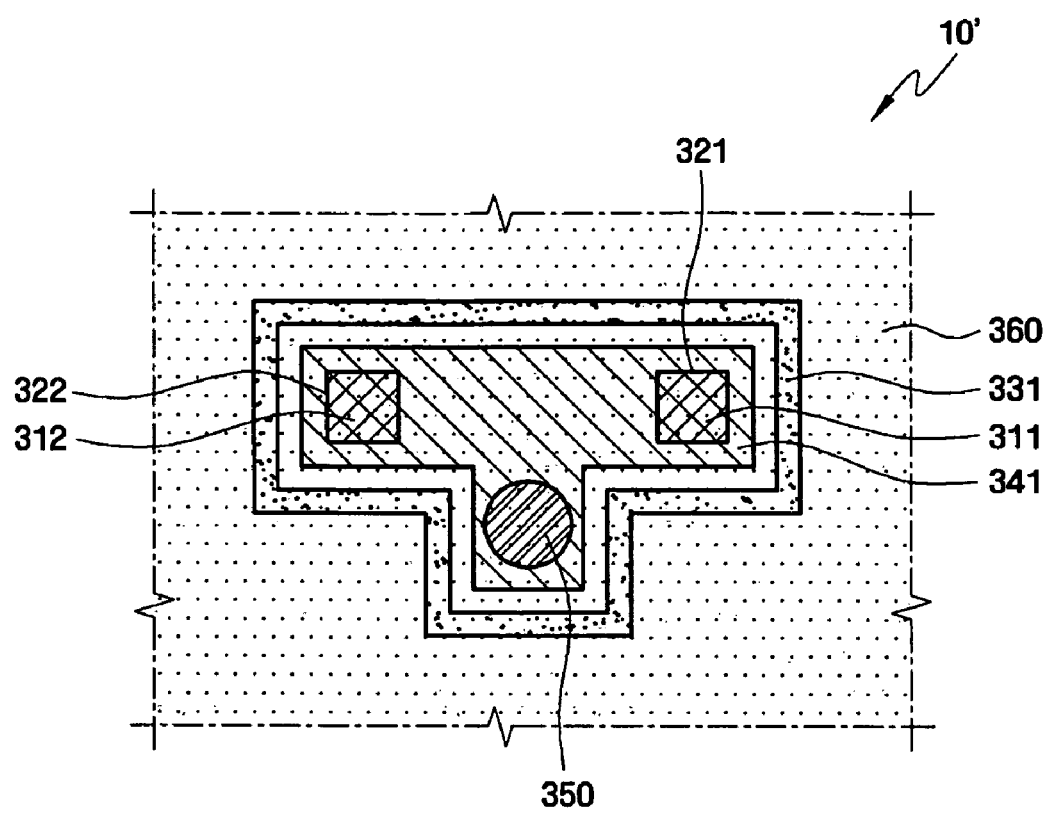
FIG. 5 illustrates a schematic, bottom view of a pad region of a semiconductor integrated circuit device according to another exemplary embodiment of the present invention.

A semiconductor integrated circuit device according to another exemplary embodiment of the present invention will now be described with reference to FIG. 5. FIG. 5 illustrates a bottom view of a pad region of a semiconductor integrated circuit device 10' according to another exemplary embodiment of the present invention.

The semiconductor integrated circuit device 10' may be substantially similar to the semiconductor integrated circuit device 10 described previously with reference to FIGS. 2-4, with the exception of having one redistribution pad 341 connected to multiple multi-layer pad structures, e.g., first and second multi-layer pad structures 311 and 312. Remaining elements of the semiconductor integrated circuit devices 10' and 10 may be substantially identical to each other, i.e., elements indicated by like reference numerals, and thus, their detailed description will be omitted.

Referring to FIG. 5, the redistribution pad 341 may be connected to two or more multi-layer pad structures 311 and 312. First and second pad contact holes 321 and 322 substantially similar to the pad contact hole 320 described previously with reference to FIGS. 2-4, may be formed to expose the first and second multi-layer pad structures 311 and 312, respectively. The redistribution pad 341 may be conformally formed in each of the first and second pad contact holes 321 and 322, and may extend on a bottom surface of the semiconductor substrate 100, as described previously with reference to the redistribution pad 340 of FIGS. 2-4. In other words, the first and second multi-layer pad structures 311 and 312 may share a single redistribution pad, i.e., the redistribution pad 341. Therefore, the first and second multi-layer pad structures 311 and 312 sharing the redistribution pad 341 may simultaneously transmit or receive signals. Accordingly, a plurality of signals may be processed at a substantially same time, so the signals may be transmitted or received more rapidly and accurately. Consequently, reliability of the semiconductor integrated circuit device can be enhanced.

The semiconductor integrated circuit device 10' according to embodiments of the present embodiment may be advantageous in providing a simplified fabrication process, and a plurality of multi-layer pad structures capable of simultaneous operation. Accordingly, simultaneously signal exchange between the plurality of multi-layer pad structures and/or external sources may be improved. Therefore, the reliability of the semiconductor integrated circuit device can be enhanced.

Hereinafter, a method of fabricating the semiconductor integrated circuit device 10 according to an exemplary embodiment of the present invention will be described with reference to FIGS. 6A through 10B. FIGS. 6A through 10B illustrate cross-sectional and bottom views of intermediate structures in a method of fabricating the semiconductor integrated circuit device 10 according to an exemplary embodiment of the present invention.

Figure 6A:
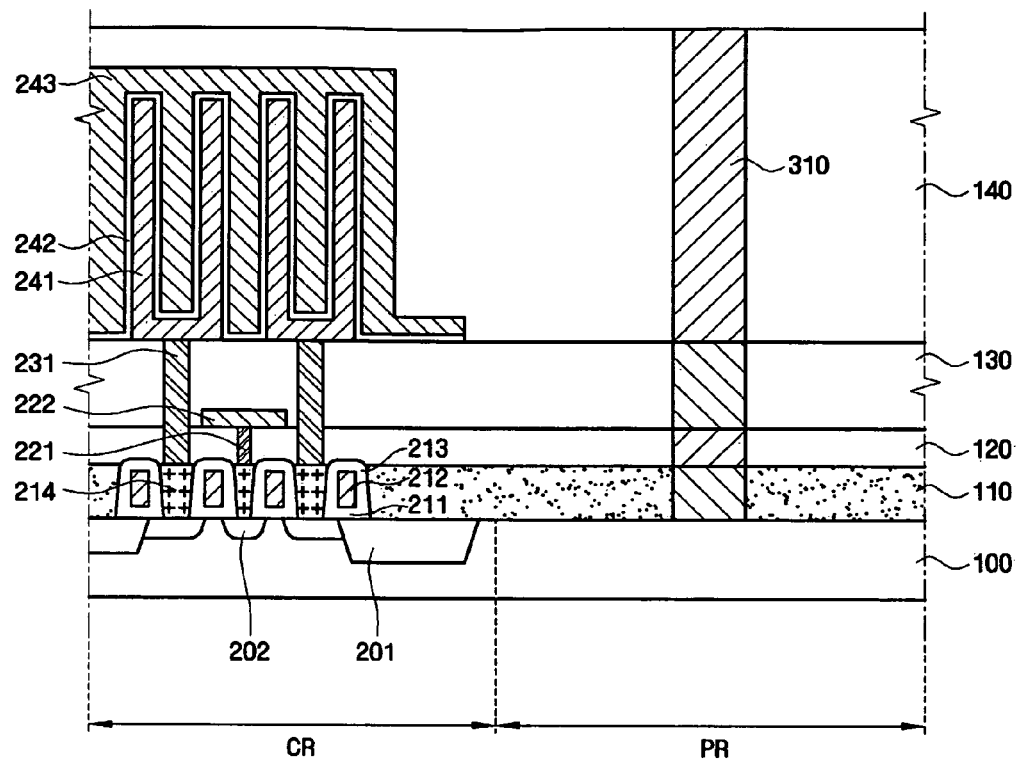
FIGS. 6A-10B illustrate sequential cross-sectional and bottom views of stages in a method of fabricating a semiconductor integrated circuit device according to an exemplary embodiment of the present invention.
Figure 6B:
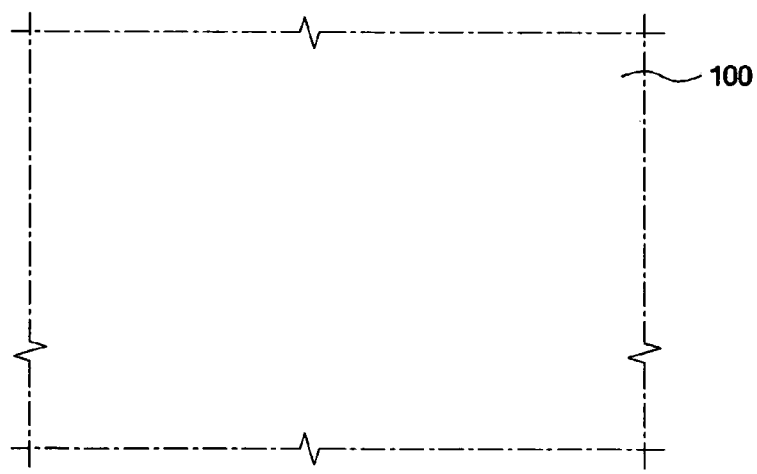

Referring to FIGS. 6A-6B, the multi-layer pad structure 310 and the integrated circuit structure 20 may be respectively formed on the pad region PR and main chip region CR of the semiconductor substrate 100. In particular, the semiconductor substrate 100 may be divided into the main chip region CR and the pad region PR surrounding the main chip region CR. Then, the integrated circuit structure 20 and the multi-layer pad structure 310 may be formed simultaneously on the semiconductor substrate 100. As described above, a substantially same mask may include a plurality of patterns having a layout corresponding to a desired structure of the multi-layer pad structure 310 and the integrated circuit structure 20, so the multi-layer pad structure 310 and the integrated circuit structure 20 may be formed simultaneously. In other words, a discontinuous pad may be formed between every two inter-layer insulation films as a mask to form portions of the multi-layer pad structure 310 and the integrated circuit structure 20. The number and/or form of pads stacked may vary according to processing and design requirements of the integrated circuit structure 20.

For example, a single-layer pad material (not shown) may be deposited on the entire upper surface of the second inter-layer insulation film 120, followed by etching the single-layer pad material to form an etch mask (not shown) on the entire upper surface of the second inter-layer insulation film 120. The etch mask may include discontinuous portions, i.e., patterns corresponding to the bitline contact 221 and a portion of the multi-layer pad structure 310. The second inter-layer insulation film 120 may be etched through the etch mask to simultaneously form the bitline contact 221 and the portion of the multi-layer pad structure 310, as illustrated in FIG. 6A.

Figure 7A:
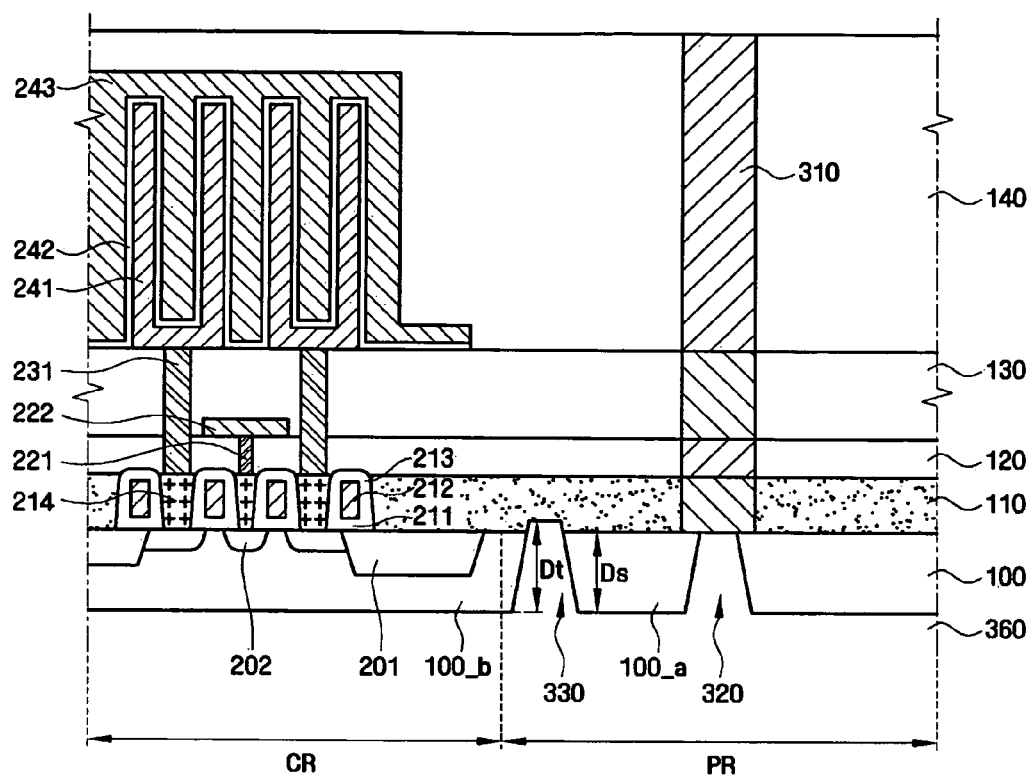
Figure 7B:
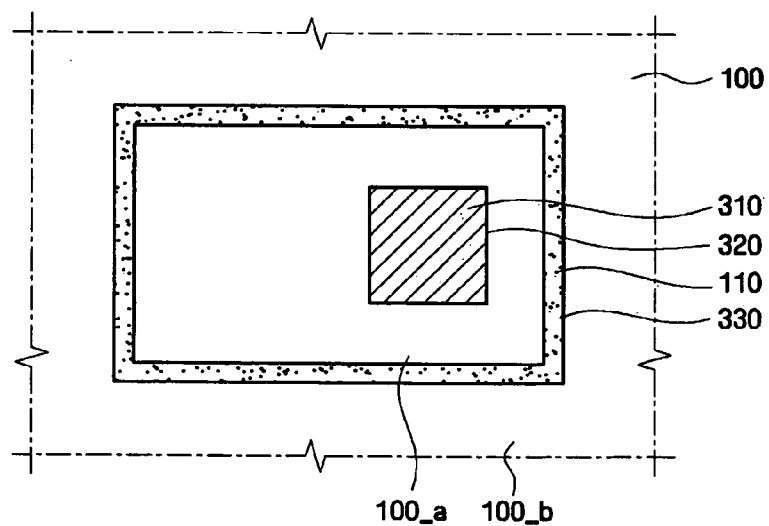

Once the multi-layer pad structure 310 and the integrated circuit structure 20 are formed, referring to FIGS. 7A-7B, the pad contact hole 320 and the trench belt 330 may be formed in the semiconductor substrate 100. The pad contact hole 320 and trench belt 330 may be formed by, e.g., a photolithography process. More specifically, a photoresist may be coated on the bottom surface of the semiconductor substrate 100, followed by exposure and developments of the bottom surface of the semiconductor substrate 100. Then, predetermined regions of the photoresist, i.e., regions corresponding to the pad contact hole 320 and the trench belt 330, may be removed to form a photoresist pattern. Next, the pad contact hole 320 and the trench belt 330 may be formed using the photoresist pattern as an etch mask.

The pad contact hole 320 may be formed by etching the bottom surface of the semiconductor substrate 100 in an upward direction until the bottom surface of the multi-layer pad structure 310 is exposed. The trench belt 330 may be formed by over-etching the bottom surface of the semiconductor substrate 100, so that a depth Dt of the trench belt 330 may be greater than a thickness Ds of the semiconductor substrate 100. For example, an etching gas having a higher etching selectivity for the semiconductor substrate 100 and for the first inter-layer insulation film 110 than for the multi-layer pad structure 310 may be used to form the trench belt 330 and the pad contact hole 320.

As illustrated in FIG. 7B, the trench belt 330 may partially expose the first inter-layer insulation film 110 formed on the semiconductor substrate 100. Thus, each sidewall of the trench belt 330 may overlap a portion of the first inter-layer insulation film 110. As further illustrated in FIG. 7B, the trench belt 330 may surround the pad contact hole 320, and may be spaced apart from the pad contact hole 320 by a predetermined distance. The trench belt 330 may be spaced apart from the pad contact hole 320 in order to secure a region for the redistribution pad 340, as will be described in more detail below with reference to FIGS. 8A-8B. The space surrounding the pad contact hole 320, i.e., the space between the pad contact hole 320 and the trench belt 330, may be the internal semiconductor substrate 100_a. Accordingly, the trench belt 330 may physically isolate and electrically insulate the pad contact hole 320 and the internal semiconductor substrate 100_a from the external semiconductor substrate 100_b.

Figure 8A:
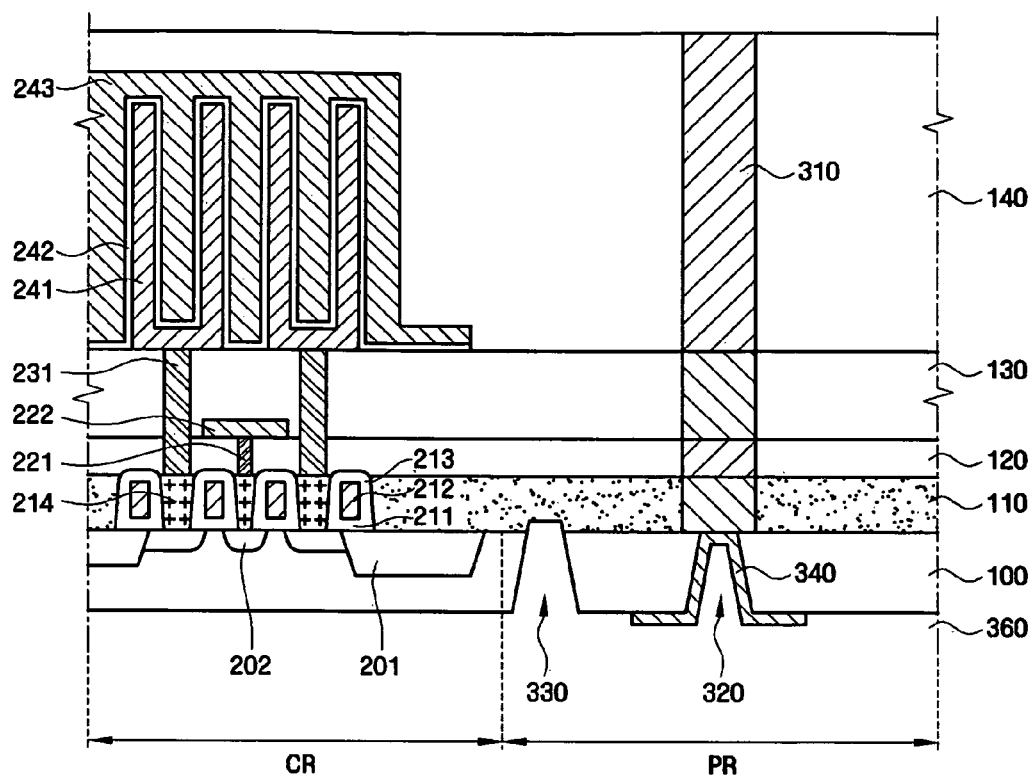
Figure 8B:
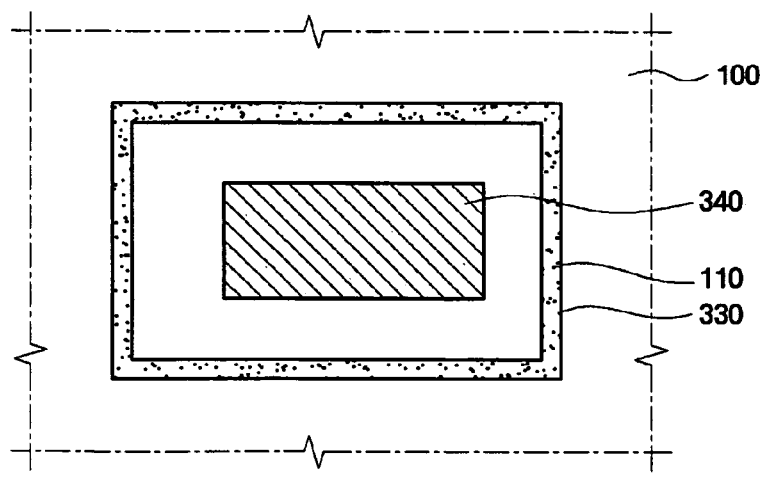

Referring to FIGS. 8A-8B, the redistribution pad 340 may be conformally formed in the pad contact hole 320 and on portions of the bottom surface of the semiconductor substrate 100. In particular, the redistribution pad 340 may be formed in the pad contact hole 320 and on portions of the bottom surface of the internal semiconductor substrate 100_a. As illustrated in FIG. 8B, the trench belt 330 may surround an entire perimeter of the redistribution pad 340, and may be spaced apart from the redistribution pad 340. The redistribution pad 340 may be formed of a conductive material, e.g., Rh, Os, Pd, Pt, W, Mo, Ti, Ta, Al, Cu, Hf, Zr, Ir, WN, MoN, TiN, TaN, AlN, HfN, ZrN, TaSiN, $RuO_2$, $IrO_2$, or a combination thereof. For example, a seed layer (not illustrated) may be formed in the pad contact hole 320 and on portions of the bottom surface of the semiconductor substrate 100, so the seed layer may be electro-plated to form the redistribution pad 340. The redistribution pad 340 may provide a spatial margin for forming the connection terminal 350, as will be discussed in more detail below with reference to FIGS. 9A-9B.

Figure 9A:
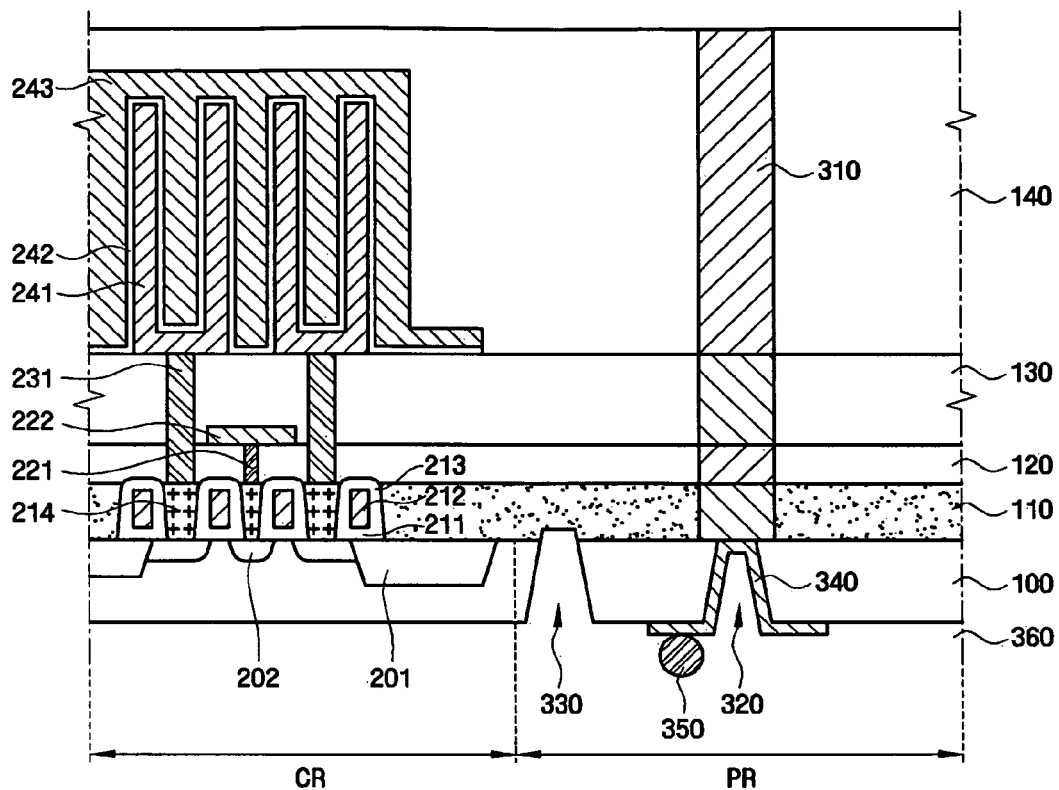
Figure 9B:
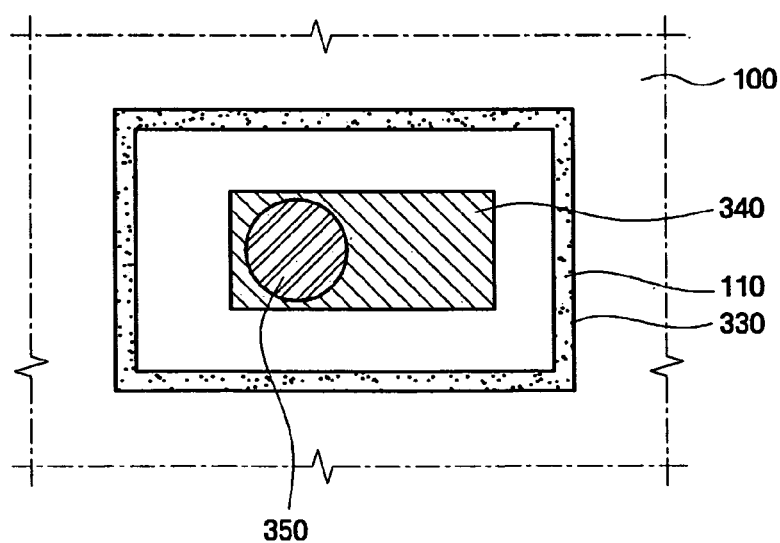

Referring to FIGS. 9A-9B, the connection terminal 350 may be formed on a portion of the redistribution pad 340. For example, the connection terminal 350 may be formed on a portion of the redistribution pad 340 positioned on the bottom surface of the semiconductor substrate 100, so the portion of the redistribution pad 340 may be between the connection terminal 350 and the bottom surface of the semiconductor surface 100. The connection terminal 350 may completely overlap the redistribution pad 340. The connection terminal 350 may be, e.g., a solder ball, formed of a conductive material, e.g., Pb, Sn, Ag, Cu, Zn, Bi, In, Al, or a combination thereof. The connection terminal 350 may be formed using, e.g., a vacuum evaporation method, an electro-plating method, or a screen-printing method.

The connection terminal 350 may facilitate electrical connection of the redistribution pad 340 to an external source. As described above, since the connection terminal 350 may function as a passage for transmitting electrical signals between the semiconductor integrated circuit device 10 and the external source, an electrical connection between the connection terminal 350 and the multi-layer pad structure 310 via the redistribution pad 340, i.e., without additional holes and/or bumps, may reduce a number of manufacturing stages of the semiconductor integrated circuit device 10, thereby simplifying the fabrication process and reducing costs thereof. Further, the simplified fabrication process may increase processing efficiency and yield.

Figure 10A:
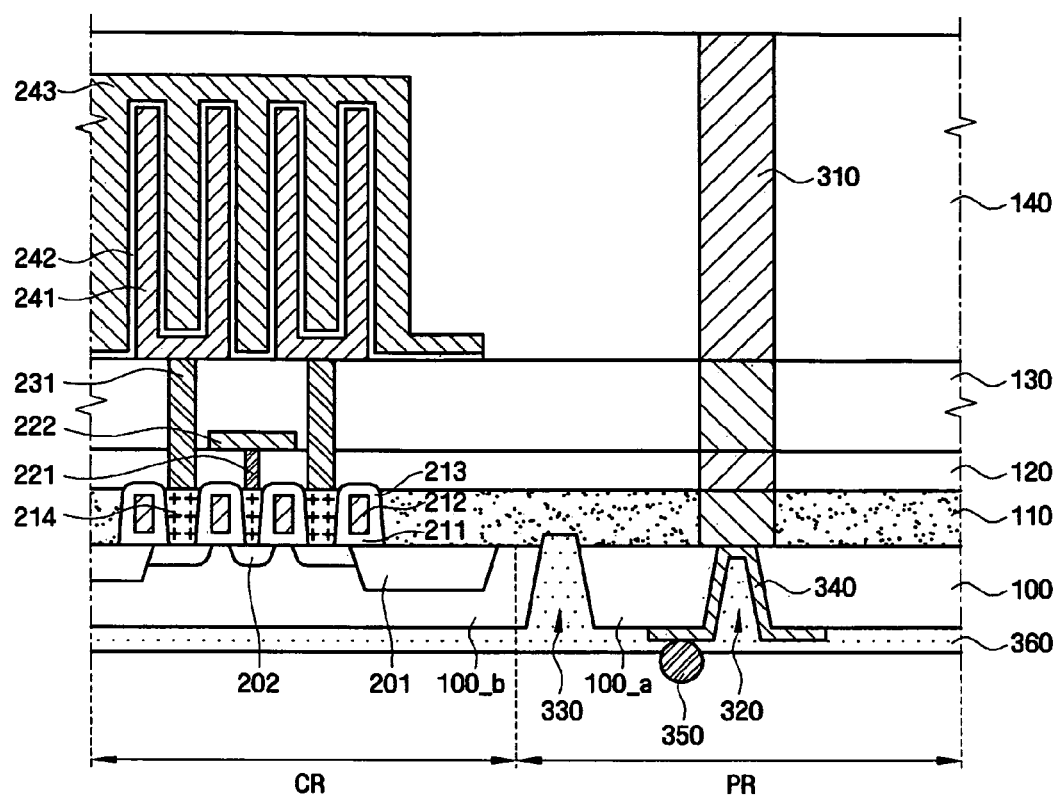
Figure 10B:
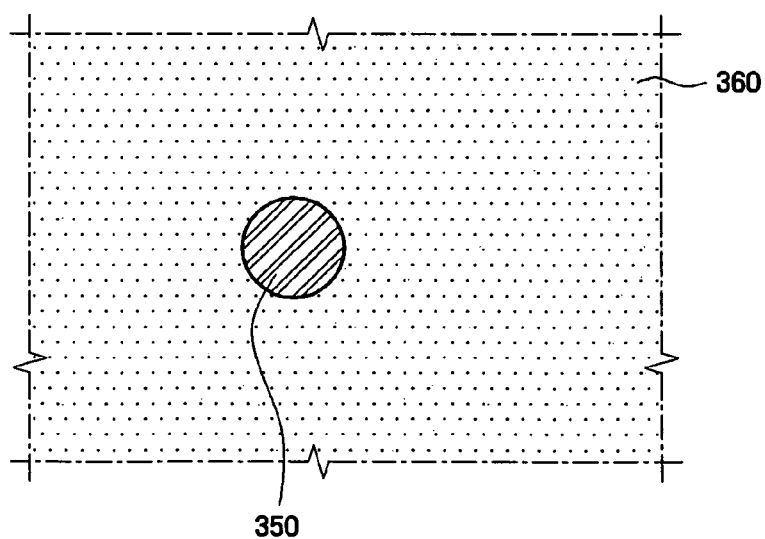

Referring to FIGS. 10A-10B, the passivation film 360 may be formed on the bottom surface of the semiconductor substrate 100 to bury the trench belt 330 and the pad contact hole 320, and to cover the redistribution pad 340, such that a portion of the connection terminal 350 may be exposed. Exposure of the connection terminal 350 via the passivation film 360 may facilitate use of the connection terminal 350 as a passage for exchanging electrical signals with the external source. For example, since the passivation film 360 is formed of an insulating material, exposure of the connection terminal 350 to the outside may facilitate transmission or receipt of various signals through the connection terminal 350. The passivation film 360 may be formed using, e.g., a chemical vapor deposition (CVD) method, a physical vapor deposition (PVD) method, and so forth. The passivation film 360 may be formed of a conductive material, and may include, e.g., an oxide film and/or a nitride film.

As further illustrated in FIG. 10A, the passivation film 360, the trench belt 330, and the first insulation film 110 may encapsulate the internal semiconductor substrate 100_a and the redistribution pad 340, so the redistribution pad 340 and the internal semiconductor substrate 100_a may be electrically isolated from the external semiconductor substrate 100_b. Therefore, no additional isolation films, e.g., for preventing or substantially minimizing signal leakage from the redistribution pad 340 to the external semiconductor substrate 100_b, may be needed to complete formation of the semiconductor integrated circuit device 10. Consequently, the process of fabricating the semiconductor integrated circuit device 10 may be simplified.

The method of fabricating the semiconductor integrated circuit device 10 according to embodiments of the present embodiment may be advantageous in omitting laser processing for connecting the redistribution pad 340 and the multi-layer pad structure 310. In addition, formation of a bump and/or of an additional insulation film between the redistribution pad 340 and the semiconductor substrate 100 may be omitted. Therefore, a number of processes in fabricating the semiconductor integrated circuit device 10 may be simplified, thereby reducing production costs and increasing processing efficiency. Consequently, productivity may be greatly enhanced.

Figure 11:
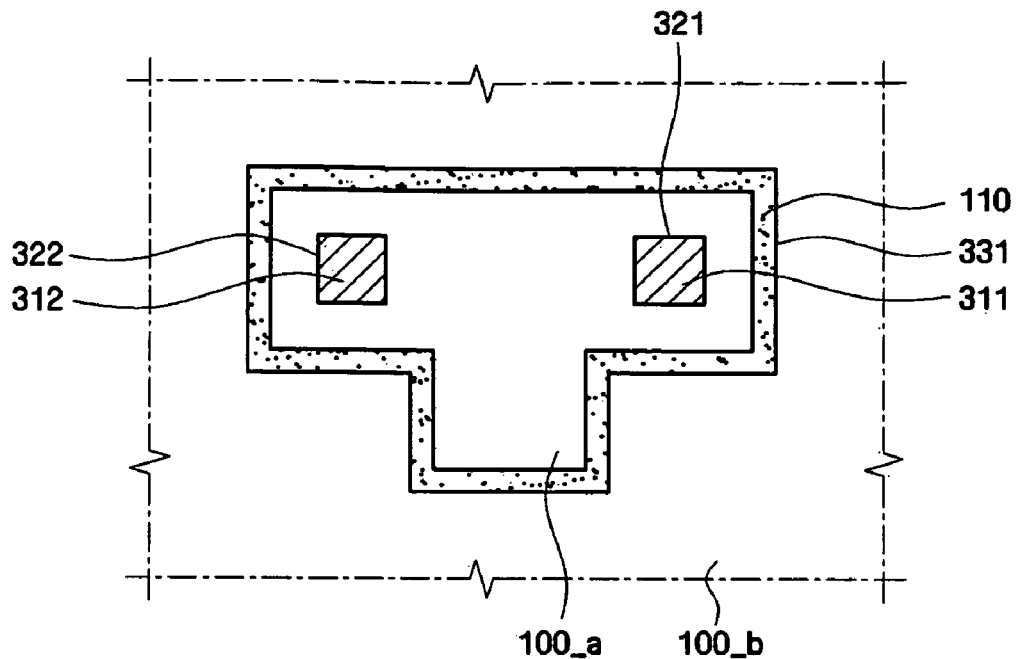
FIGS. 11-13 illustrate sequential cross-sectional and bottom views of stages in a method of fabricating a semiconductor integrated circuit device according to another exemplary embodiment of the present invention.
Figure 12:
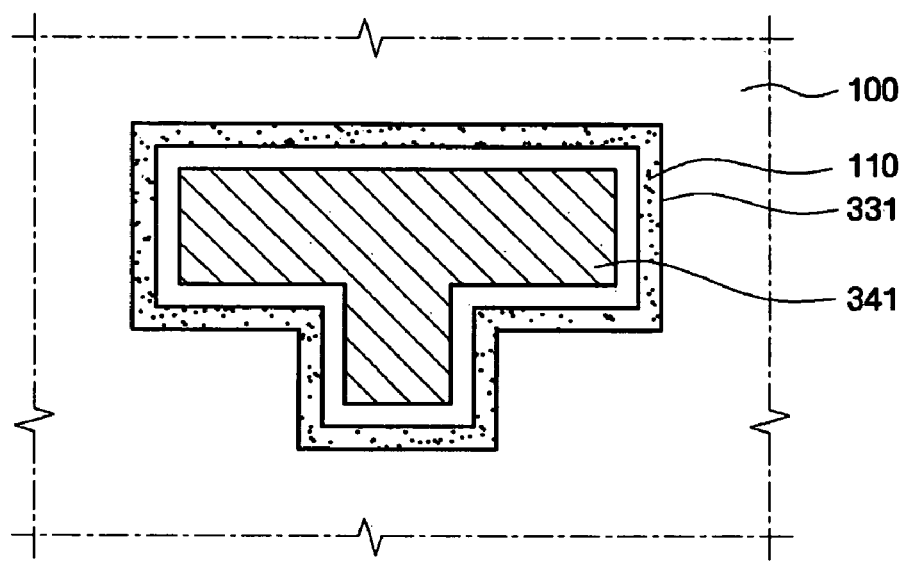
Figure 13:
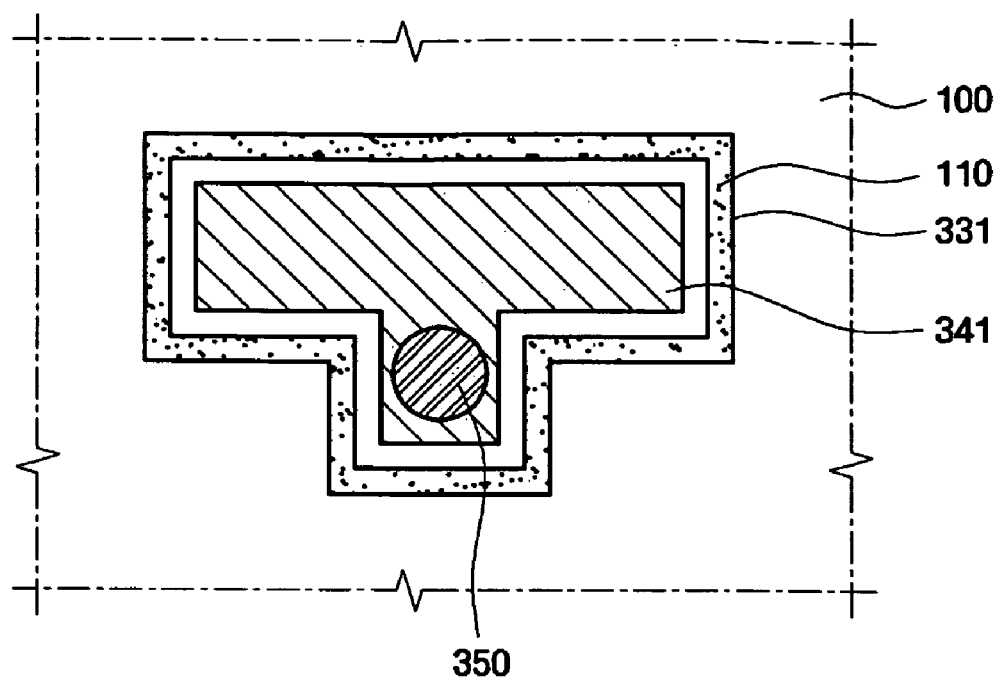

Hereinafter, a method of fabricating a semiconductor integrated circuit device 10' according to another exemplary embodiment of the present invention will be described with reference to FIGS. 11-13. FIGS. 11-13 illustrate bottom views of intermediate structures in a method of fabricating the semiconductor integrated circuit device 10' according to another exemplary embodiment of the present invention.

The method of fabricating the first and second multi-layer pad structures 311 and 312 and the integrated circuit structure 20 of the semiconductor integrated circuit device 10' may be substantially similar to the method of fabricating the multi-layer pad structure 310 and the integrated circuit structure 20 described previously with reference to FIGS. 6A-6B, and therefore, will not be repeated.

Referring to FIG. 11, a trench belt 331 may be formed to penetrate through the semiconductor substrate 100 from the bottom surface thereof, and may surround two or more pad contact holes, e.g., first and second pad contact holes 321 and 322. Formation of the trench belt 331 may be substantially similar to the formation of the trench belt 330 described previously with reference to FIGS. 7A-7B, with the exception of its cross-section and size due to surrounding a plurality of pad contact holes. For example, the trench belt 331 may be T-shaped, as illustrated in FIG. 11, so the first and second pad contact holes 321 and 322 may be positioned in opposing sides of the T. More specifically, the first and second pad contact holes 321 and 322 may be formed by, e.g., etching the bottom surface of the semiconductor substrate 100 to expose bottom surfaces of the first and second multi-layer pad structures 311 and 312, respectively. The trench belt 331 may be formed by over-etching the bottom surface of the semiconductor substrate 100 until the first inter-layer insulation film 110 is exposed, and may surround the first and second pad contact holes 321 and 322. The trench belt 331 may physically isolate the inner semiconductor substrate 100_a, i.e., a portion of the semiconductor substrate 100 immediately adjacent to the first and second pad contact holes 321 and 322, from the external semiconductor substrate 100_b.

Referring to FIG. 12, the redistribution pad 341 may be conformally formed in the first and second pad contact holes 321 and 322, and may extend on the bottom surface of the semiconductor substrate 100. Hence, the redistribution pad 341 may contact and may be electrically connected to the first and second multi-layer pad structures 311 and 312 exposed thorough respective first and second pad contact holes 321 and 322. For example, the redistribution pad 341 may have a T-shaped cross section surrounded by the trench belt 331, as illustrated in FIG. 12.

Referring to FIG. 13, the connection terminal 350 may be formed on the redistribution pad 341. For example, the connection terminal 350 and the first and second pad contact holes 321 and 322 may correspond to three edges of the T-shaped cross section of the redistribution pad 341, as illustrated in FIG. 13. The connection terminal 350 may be, e.g., a solder ball, and may be made of a conductive material. In addition, the connection terminal 350 may be formed using the vacuum evaporation method, the electro-plating method, or the screen-printing method. However, the present invention is not limited thereto. A subsequent process of forming a passivation film, e.g., the passivation film 360 of FIG. 10B, on the bottom surface of the semiconductor substrate 100 to partially expose the connection terminal 350 may be substantially identical to formation of the passivation film 360 of the semiconductor integrated circuit device 10 described previously with reference to FIGS. 10A-10B.

In the method of fabricating the semiconductor integrated circuit device 10' according to embodiments of the present embodiment, the fabrication process may be simplified, and a plurality of multi-layer pad structures may simultaneously exchange signals with each other. Therefore, a semiconductor integrated circuit device with enhanced reliability may be produced.

As described above, in a semiconductor integrated circuit device and a method of fabricating the same according to embodiments of the present invention, a multi-layer pad structure and a trench belt may be formed, so no additional holes and/or bumps may be required. In addition, there may be no need to form an additional insulation film on a bottom surface of the semiconductor substrate. Therefore, a process of fabricating the semiconductor integrated circuit device may be simplified, thereby reducing production costs and increasing processing efficiency. Accordingly, productivity of the semiconductor integrated circuit device may be enhanced.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor integrated circuit device, comprising:
   a semiconductor substrate including a main chip region and a pad region;
   a multi-layer pad structure on the pad region of the semiconductor substrate;
   a redistribution pad through the semiconductor substrate and in contact with a bottom surface of the multi-layer pad structure, the redistribution pad being electrically connected to the multi-layer pad structure;
   a trench belt through the semiconductor substrate and surrounding the redistribution pad, the trench belt electrically isolating the redistribution pad and a portion of the semiconductor substrate adjacent to the redistribution pad; and
   a connection terminal on the redistribution pad, the connection terminal electrically connecting the redistribution pad to an external source.

2. The semiconductor integrated circuit device as claimed in claim 1, wherein the multi-layer pad structure includes a conductive material, the multi-layer pad structure being a stacked structure of a contact, a plurality of lines, and a plurality of vias connecting the lines to one other.

3. The semiconductor integrated circuit device as claimed in claim 1, further comprising a plurality of multi-layer pad structures on the pad region of the semiconductor substrate, the redistribution pad being electrically connected to each of the multi-layer pad structures.

4. The semiconductor integrated circuit device as claimed in claim 1, further comprising a pad contact hole through the semiconductor substrate, the pad contact hole exposing the bottom surface of the multi-layer pad structure, and the redistribution pad being on a portion of a bottom surface of the semiconductor substrate and on sidewalls of the pad contact hole.

5. The semiconductor integrated circuit device as claimed in claim 1, wherein a depth of the trench belt is greater than a thickness of the semiconductor substrate.

6. The semiconductor integrated circuit device as claimed in claim 1, further comprising a passivation film on a bottom surface of the semiconductor substrate to bury the trench belt, the connection terminal being configured through the passivation film.

7. A semiconductor integrated circuit device, comprising:
   a semiconductor substrate including a main chip region and a pad region;
   a plurality of inter-layer insulation films on the semiconductor substrate;
   a multi-layer pad structure on the semiconductor substrate, the multi-layer pad structure penetrating through the inter-layer insulation films in the pad region of the semiconductor substrate;
   a pad contact hole through the semiconductor substrate, the pad contact hole exposing a bottom surface of the multi-layer pad structure;
   a redistribution pad in the pad contact hole and on portions of a bottom surface of the semiconductor substrate, the redistribution pad being electrically connected to the multi-layer pad structure;
   a trench belt through the semiconductor substrate and surrounding the redistribution pad, the trench belt electrically isolating the redistribution pad and a portion of the semiconductor substrate adjacent to the redistribution pad;
   a passivation film on the bottom surface of the semiconductor substrate and on the redistribution pad, the passivation film burying the trench belt and the pad contact hole; and
   a connection terminal through the passivation film and exposed therethrough, the connection terminal being on the redistribution pad and electrically connected thereto.

8. The semiconductor integrated circuit device as claimed in claim 7, wherein the multi-layer pad structure is a stacked structure of a contact, a plurality of lines, and a plurality of vias connecting the lines to one other.

9. The semiconductor integrated circuit device as claimed in claim 7, wherein the connection terminal is a solder ball.

10. The device as claimed in claim 7, wherein the pad region of the semiconductor substrate includes a plurality of multi-layer pad structures, the redistribution pad being electrically connected to each of the multi-layer pad structures.

11. The semiconductor integrated circuit device as claimed in claim 7, wherein a depth of the trench belt is greater than a thickness of the semiconductor substrate.

12. A method of fabricating a semiconductor integrated circuit device, comprising:
   forming a multi-layer pad structure on a pad region of a semiconductor substrate;
   forming a redistribution pad through the semiconductor substrate and in contact with a bottom surface of the multi-layer pad structure, the redistribution pad being electrically connected to the multi-layer pad structure;
   forming a trench belt through the semiconductor substrate and surrounding the redistribution pad, the trench belt electrically isolating the redistribution pad and a portion of the semiconductor substrate adjacent to the redistribution pad; and
   forming a connection terminal on the redistribution pad and electrically connecting the redistribution pad to the outside.

13. The method as claimed in claim 12, wherein forming the multi-layer pad structure includes forming an integrated circuit structure with a plurality of contacts, a plurality of lines, and a plurality of vias connecting the lines to one another.

14. The method as claimed in claim 12, wherein forming the redistribution pad includes,
   forming a pad contact hole through the semiconductor substrate, the pad contact hole exposing the bottom surface of the multi-layer pad structure; and
   conformally forming the redistribution pad in the pad contact hole and on portions of a bottom surface of the semiconductor substrate.

15. The method as claimed in claim 12, further comprising forming a plurality of multi-layer pad structures on the semiconductor substrate, such that the redistribution pad is electrically connected to each of the multi-layer pad structures.

16. The method as claimed in claim 12, wherein forming the trench belt includes over-etching the semiconductor substrate, such that a depth of the trench belt is greater than a thickness of the semiconductor substrate.

17. The method as claimed in claim 12, wherein forming the trench belt includes separating the trench belt from the pad contact hole by a predetermined distance.

18. The method as claimed in claim 12, wherein forming the redistribution pad includes electro-plating a redistribution pad seed layer.

19. The method as claimed in claim 12, further comprising forming a passivation film on the bottom surface of the semiconductor substrate and on the redistribution pad, such that the trench belt is buried.

20. The method as claimed in claim 19, wherein the connection terminal is formed through the passivation film, a portion of the connection terminal being exposed to an outside through the passivation film.

* * * * *